United States Patent
Hah et al.

(10) Patent No.: US 9,036,429 B2
(45) Date of Patent: May 19, 2015

(54) NONVOLATILE MEMORY DEVICE AND OPERATING METHOD THEREOF

(71) Applicant: SK hynix Inc., Icheon-si Gyeonggi-do (KR)

(72) Inventors: Beom Seok Hah, Icheon-si (KR); Jung Hwan Lee, Icheon-si (KR); Ji Hwan Kim, Icheon-si (KR); Myung Cho, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 232 days.

(21) Appl. No.: 13/713,505

(22) Filed: Dec. 13, 2012

(65) Prior Publication Data
US 2014/0036604 A1  Feb. 6, 2014

(30) Foreign Application Priority Data

Aug. 6, 2012 (KR) .................... 10-2012-0085680

(51) Int. Cl.
| | |
|---|---|
| *G11C 5/14* | (2006.01) |
| *G11C 7/00* | (2006.01) |
| *G11C 29/46* | (2006.01) |
| *G11C 29/16* | (2006.01) |

(52) U.S. Cl.
CPC ........ *G11C 7/00* (2013.01); *G11C 29/46* (2013.01); *G11C 29/16* (2013.01)

(58) Field of Classification Search
USPC .................. 365/189.09, 185.2, 185.18
See application file for complete search history.

(56) References Cited

U.S. PATENT DOCUMENTS

| | | | | |
|---|---|---|---|---|
| 7,518,930 | B2 * | 4/2009 | Miwa .................... | 365/185.23 |
| 7,542,350 | B2 * | 6/2009 | Park et al. ............. | 365/185.24 |
| 8,228,740 | B2 * | 7/2012 | Joo ........................ | 365/185.22 |
| 8,472,245 | B2 * | 6/2013 | Kim ...................... | 365/185.03 |
| 8,582,360 | B2 * | 11/2013 | Park et al. ............. | 365/185.09 |
| 8,724,394 | B2 * | 5/2014 | Choe et al. ............ | 365/185.2 |

FOREIGN PATENT DOCUMENTS

| | | | |
|---|---|---|---|
| KR | 1020050099773 | A | 10/2005 |
| KR | 1020060068187 | A | 6/2006 |

* cited by examiner

*Primary Examiner* — Pho M Luu
(74) *Attorney, Agent, or Firm* — William Park & Associates Ltd.

(57) ABSTRACT

A nonvolatile memory device including a memory cell arranged at a region where a word line and a bit line cross each other; a control signal generator configured to be enabled while the nonvolatile memory device operates in a test mode, and generate control signals which are not provided from an external device, based on a reference signal provided from the external device; and a control logic configured to control an operation for the memory cell according to the generated control signals.

23 Claims, 5 Drawing Sheets

NONVOLATILE MEMORY DEVICE AND OPERATING METHOD THEREOF

CROSS-REFERENCES TO RELATED APPLICATION

The present application claims priority under 35 U.S.C. §119(a) to Korean application number 10-2012-0085680, filed on Aug. 6, 2012, in the Korean Intellectual Property Office, which is incorporated herein by reference in its entirety.

BACKGROUND

1. Technical Field

The present invention generally relates to a semiconductor memory device, and more particularly, to a nonvolatile memory device and an operating method thereof.

2. Related Art

In general, a semiconductor memory device is classified into a volatile memory device and a nonvolatile memory device. The volatile memory device loses data stored therein when power supply is cut off, but the nonvolatile memory device maintains data stored therein even though power supply is cut off. The nonvolatile memory device may include various types of memory cells.

The nonvolatile memory device may be divided into a flash memory device, a ferroelectric RAM (FRAM) using a ferroelectric capacitor, a magnetic RAM (MRAM) using a tunneling magneto-resistive (TMR) layer, a phase change memory device using chalcogenide alloys, a resistive RAM (ReRAM) using transition metal oxide and the like, depending on the structure of memory cells.

Among the nonvolatile memory devices, the flash memory device is roughly divided into a NOR flash memory device and a NAND flash memory device, depending on the connection state between memory cells and a bit line. The NOR flash memory device has a structure in which two or more memory cell transistors are connected in parallel to one bit line. Therefore, the NOR flash memory device has an excellent random access time characteristic. On the other hand, the NAND flash memory device has a structure in which two or more memory cell transistors are connected in series to one bit line. Such a structure is referred to as a cell string, and one bit line contact is required per one cell string. Therefore, the NAND flash memory device has an excellent characteristic in terms of integration degree.

Among the nonvolatile memory devices, a flash memory device uses an input/output (I/O) multiplexing method. That is, commands and addresses as well as data are provided to the flash memory device through data I/O pins (or pads). In order to use the v multiplexing method, the flash memory device may determine which signal is applied through the data I/O pins (or pads) through a combination of input control signals.

SUMMARY

A nonvolatile memory device capable of generating control signals based on a reference signal and an operating method thereof are described herein.

In an embodiment, a nonvolatile memory device includes: a memory cell arranged at a region where a word line and a bit line cross each other; a control signal generator configured to be enabled while the nonvolatile memory device operates in a test mode, and generate control signals which are not provided from an external device, based on a reference signal provided from the external device; and a control logic configured to control an operation for the memory cell according to the generated control signals.

In an embodiment, an operating method of a nonvolatile memory device including one or more memory cells includes the steps of: determining whether the nonvolatile memory device is operating in a test mode or not; generating control signals which are not provided from an external device, based on a reference signal provided from the external device, when the nonvolatile memory device operates in the test mode; and performing a test operation according to the generated control signals.

BRIEF DESCRIPTION OF THE DRAWINGS

Features, aspects, and embodiments are described in conjunction with the attached drawings, in which.

DETAILED DESCRIPTION

Hereinafter, a nonvolatile memory device and an operating method thereof according to various embodiments will be described below with reference to the accompanying drawings through the various embodiments.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
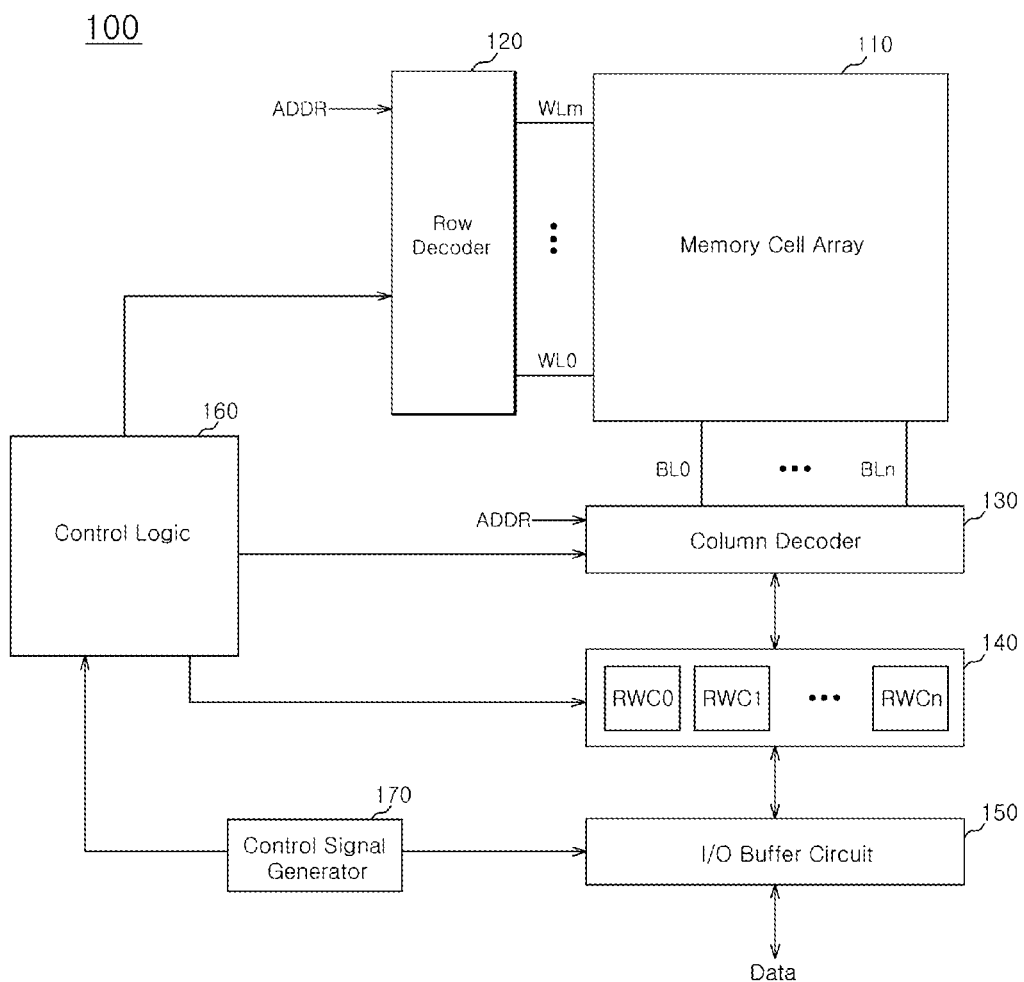
FIG. 1 is a block diagram illustrating a nonvolatile memory device according to an embodiment.

FIG. 1 is a block diagram illustrating a nonvolatile memory device according to an embodiment. Referring to FIG. 1, the nonvolatile memory device 100 may include a memory cell array 110, a row decoder 120, a column decoder 130, a data read/write circuit 140, an input/output (I/O) buffer circuit 150, a control logic 160, and a control signal generator 170.

The memory cell array 110 may include a plurality of memory cells arranged at regions where bit lines BL0 to BLn and word lines WL0 to WLm cross each other. Each of the memory cells may store one-bit data. Such a memory cell is referred to as a single level cell (SLC). The SLC is programmed in such a manner as to have a threshold voltage corresponding to an erase state and one program state. As another example, each of the memory cells may store two or more-bit data. Such a memory cell is referred to as a multi-level cell (MLC). The MLC is programmed in such a manner as to have a threshold voltage corresponding to an erase state and any one of a plurality of program states. The memory cell array 110 may be implemented to have a single-layer array structure or multi-layer array structure. The single-layer array structure is referred to as a 2D array structure, and the multi-layer array structure is referred to as a 3D array structure.

The row decoder 120 operates according to the control of the control logic 160. The row decoder 120 is connected to the memory cell array 110 through the plurality of word lines WL0 to WLm. The row decoder 120 is configured to decode an address ADDR inputted from outside. The row decoder 120 is configured to selectively drive the word lines WL0 to WLm according to the decoding result.

The column decoder 130 operates according to the control of the control logic 160. The column decoder 130 is connected to the memory cell array 110 through the bit lines BL0 to BLn. The column decoder 130 is configured to decode the address ADDR. The column decoder 130 is configured to sequentially connect the bit lines BL0 to BLn to the data read/write circuit 140 by the predetermined unit according to the decoding result.

The data read/write circuit 140 operates according to the control of the control logic 160. The data read/write circuit 140 is configured to operate as a write driver or sense amplifier depending on an operation mode. For example, the data read/write circuit 140 is configured to store data inputted through the I/O buffer circuit 150 in memory cells of the memory cell array 110 during a program operation. For another example, the data read/write circuit 140 is configured to output data read from memory cells of the memory cell array 110 to the I/O buffer circuit 150 during a read operation. The data read/write circuit 140 may include a plurality of data read/write circuits RWC0 to RWCn corresponding to the respective bit line BL0 to BLn (or bit line pairs). For this reason, the bit lines BL0 to BLn (or bit line pairs) may be selected or controlled by the corresponding data read/write circuits RWC0 to RWCn.

The I/O buffer circuit 150 is configured to receive data from an external device (for example, a memory controller, a memory interface, a host device or the like) or output data to the external device. For this operation, the I/O output buffer circuit 150 may include a data latch circuit (not illustrated) and an output driving circuit (not illustrated).

The control logic 160 is configured to control overall operations of the nonvolatile memory device 100 in response to control signals provided from the external device. For example, the control logic 160 may control read, program (or write), and erase operations of the nonvolatile memory device 100. Furthermore, the control logic 160 may control a specific operation such as a test mode, in addition to the read, program, and erase operations. The test mode indicates a specific operation mode which is provided to test the nonvolatile memory device 100 or set an operation of the nonvolatile memory device, an initial value or the like.

The control signal generator 170 is configured to generate control signals based on a reference signal provided from an external device (for example, test device). For example, while the nonvolatile memory device operates in the test mode, only a part of control signals required for the operation may be provided to the nonvolatile memory device 100, because of the physical environment of the external device (for example, test device). In this case, the control signal generator 170 is configured to generate the control signals which are not provided, based on the provided reference signal. The control signals generated through the control signal generator 170 will be described in detail with reference to FIG. 2.

For example, the control signal generator 170 may include a circuit block separated from the input/output buffer circuit 150 or the control logic 160. According to design change, however, the control signal generator 170 may be included in the input/output buffer circuit 150 or the control logic 160.

According to an embodiment, the nonvolatile memory device 100 may internally generate control signals which are not provided from an external device, while operating in the test mode. Therefore, the number of pins (or pads) for applying control signals required for controlling the nonvolatile memory device 100 may be reduced. Furthermore, the control of the nonvolatile memory device 100 may be simplified.

Figure 2:
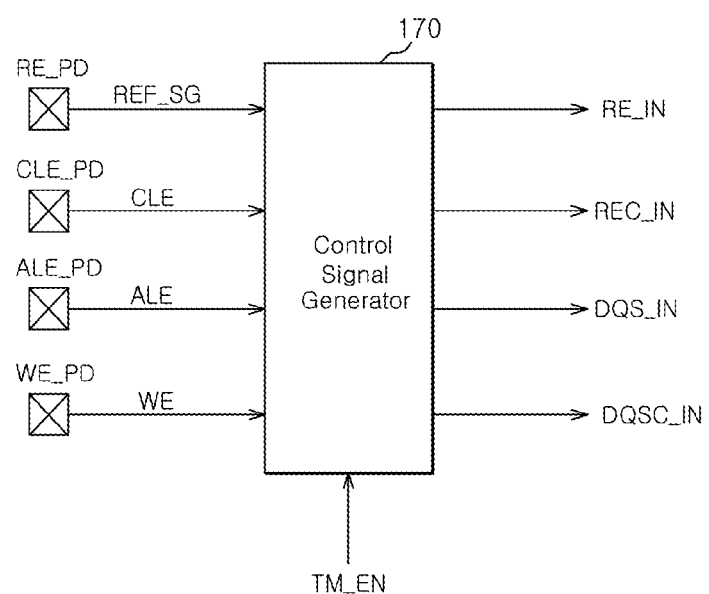
FIG. 2 is a block diagram of a control signal generator according to an embodiment.

FIG. 2 is a block diagram of the control signal generator according to an embodiment. Referring now to FIG. 2, in general, a pad "_PD" indicates a pad (or pin) through which a control signal provided from an external device is applied, and an input terminal "_IN" indicates a specific node of a circuit block (for example, control logic 160 of FIG. 1), to which the control signal provided through the pad _PD may be inputted.

As described above, the nonvolatile memory device 100 of FIG. 1 uses an I/O multiplexing method. That is, the nonvolatile memory device 100 may receive commands and addresses as well as data through data I/O pins (or pads). In order to use the I/O multiplexing method, the nonvolatile memory device 100 may determine which signals are applied through the data I/O pins (or pads) through a combination of input control signals.

For example, the control signals may include a command latch enable signal CLE, an address latch enable signal ALE, a write enable signal WE, and a read enable signal RE. Such control signals are used only to describe an embodiment, and may differ depending on the type of the nonvolatile memory device 100.

The command latch enable signal CLE may be a signal which may be provided to the nonvolatile memory device 100 in order to announce that a signal inputted through the data I/O pins may be a command. The address latch enable signal ALE may be a signal which may be provided to the nonvolatile memory device 100 in order to announce that a signal inputted through the data I/O pins may be an address. The write enable signal WE may be a signal which may be provided to the nonvolatile memory device 100 in order to input a command, address, or data through the data I/O pins. The read enable signal RE may be a signal which may be provided to the nonvolatile memory device 100 in order to control the data read/write circuit 140 of FIG. 1 to output data to the outside through the input/output buffer circuit 150, the data read/write circuit 140 temporarily storing data read from memory cells.

Additionally, the nonvolatile memory device 100 may use a data strobe signal DQS, in order to increase the input/output speed of data. The nonvolatile memory device 100 may be configured to receive data in synchronization with the data strobe signal DQS provided from an external device. In this case, the nonvolatile memory device 100 may receive data regardless of the write enable signal WE. The nonvolatile memory device 100 may be configured to provide the data strobe signal DQS and data synchronized with the data strobe signal DQS to the external device.

The control signal generator 170 may be enabled in response to the test mode enable signal TM_EN while the nonvolatile memory device 100 operates in the test mode. The control signal generator 170 may be configured to generate control signals which are not provided from the external device, based on a reference signal REF_SG. For example, the control signal generator 170 may generate a data strobe signal pair DQS and DQSC and a read enable signal pair RE and REC. The generated data strobe signal pair DQS and DQSC may be transmitted to data strobe signal input terminals DQS_IN and DQSC_IN, respectively. The generated read enable signal pair RE and REC may be transmitted to read enable signal input terminals RE_IN and REC_IN, respectively.

During a normal data I/O operation, the command latch enable signal CLE, the address latch enable signal ALE, and the write enable signal WE may not be provided to the nonvolatile memory device 100. However, while the nonvolatile memory device 100 operates in the test mode, the command latch enable signal CLE, the address latch enable signal ALE, and the write enable signal WE may be provided to the nonvolatile memory device 100, for the control signal generation operation of the control signal generator 170. The control signal generator 170 may be configured to generate the data strobe signal pair DQS and DQSC or the read enable signal pair RE and REC according to a combination of the command latch enable signal CLE, the address latch enable signal ALE, and the write enable signal WE. The control signals generated through the control signal generator 170 will be described in detail with reference to FIGS. 3 and 4.

FIG. 2 illustrates that the reference signal REF_SG may be provided through a pad RE_PD for applying the read enable signal RE. However, the reference signal REF_SG may be provided through other control signal pads to which control signals are not applied. For example, the reference signal REF_SG may be provided through a pad for applying the read enable complementary signal REC, a pad for applying the data strobe signal DQS, or a pad for applying the data strobe complementary signal DQSC from the external device. As well known, the complementary signal has the opposite phase of an original signal.

Figure 3:
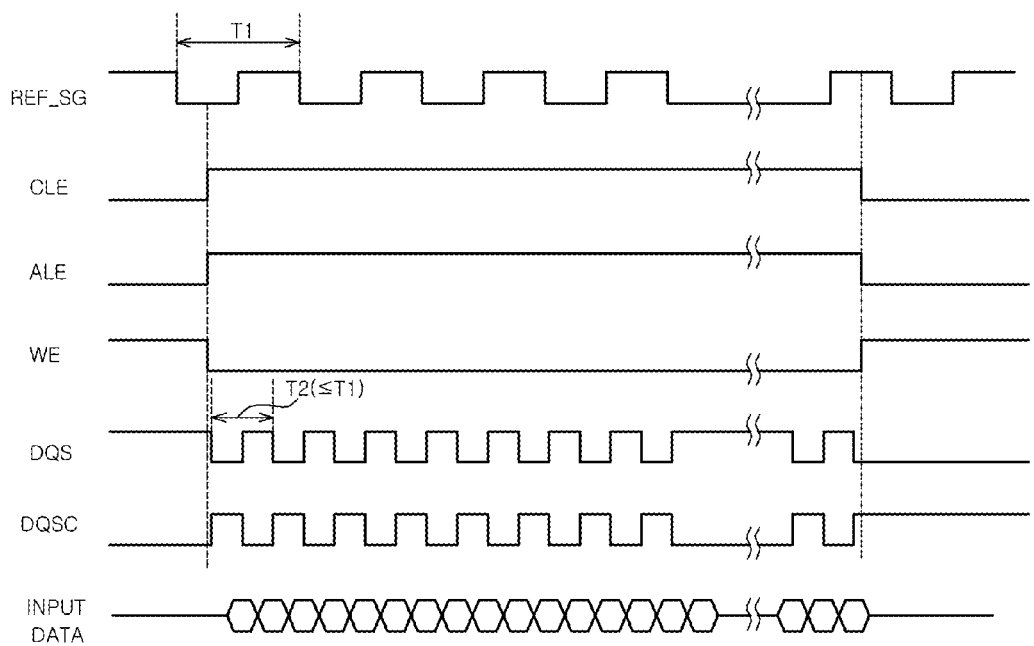
FIG. 3 is a timing diagram for explaining a data input operation of the nonvolatile memory device according to an embodiment.

FIG. 3 is a timing diagram for explaining a data input operation (i.e., INPUT DATA) of the nonvolatile memory device according to an embodiment. In FIG. 3, suppose that the nonvolatile memory device 100 entered the test mode according to a command and address provided from the external device (for example, test device), and was set in a state for receiving data, for convenience of description.

When the command latch enable signal CLE and the address latch enable signal ALE are activated to a logic high level and the write enable signal WE is activated to a logic low level, the control signal generator 170 generates the data strobe signal pair DQS and DQSC based on the reference signal REF_SG. The control signal generator 170 may generate the data strobe signal pair DQS and DQSC having a period T2 different from the period T1 of the reference signal REF_SG. That is, the control signal generator 170 may generate the data strobe signal pair DQS and DQSC by varying the period T1 of the reference signal REF_SG. For example, the period T2 of the data strobe signal pair DQS and DQSC may be faster than the period T1 of the reference signal REF_SG (i.e., T2 (≤T1)).

Although the data strobe signal pair DQS and DQSC is not provided from the external device while the nonvolatile memory device 100 operates in the test mode, the nonvolatile memory device 100 may receive data according to the data strobe signal pair DQS and DQSC generated by the control signal generator 170, and perform a test program operation.

Figure 4:
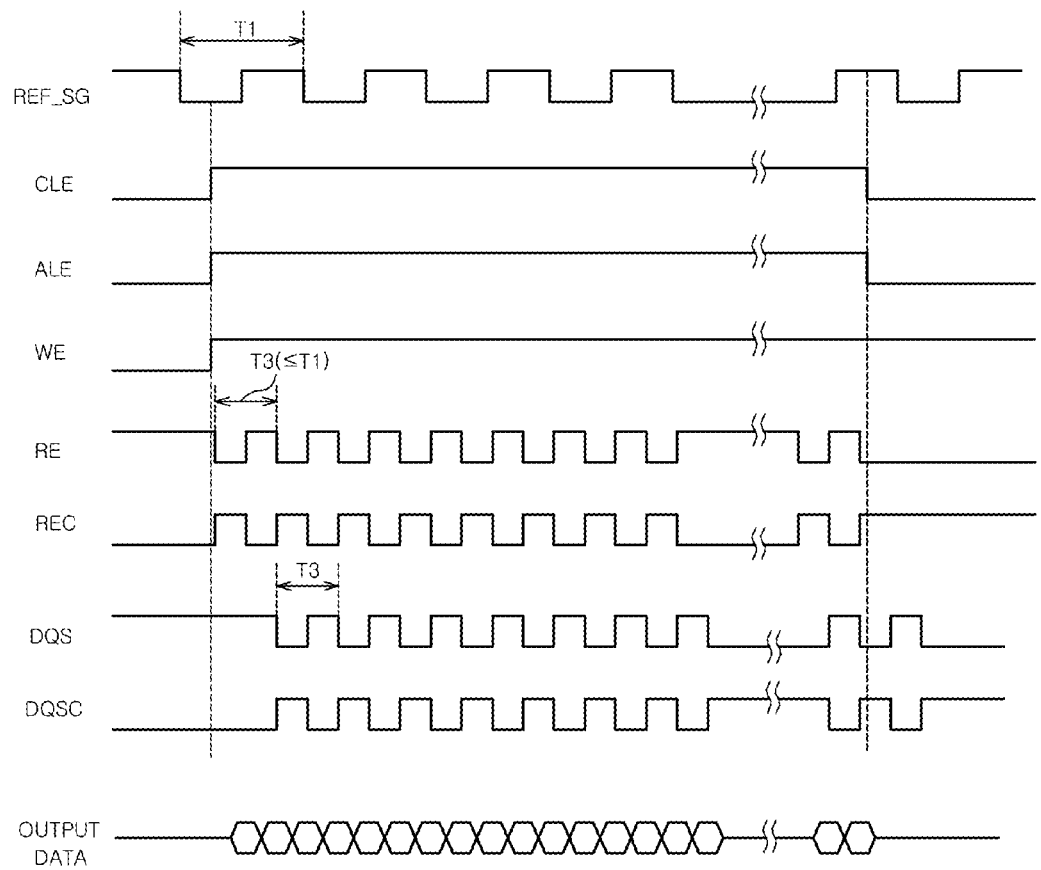
FIG. 4 is a timing diagram for explaining a data output operation of the nonvolatile memory device according to an embodiment.

FIG. 4 is a timing diagram for explaining a data output operation (i.e., OUTPUT DATA) of the nonvolatile memory device according to an embodiment. In FIG. 4, suppose that the nonvolatile memory device 100 entered the test mode according to a command and address provided from the external device (for example, test device) and was set in a state for outputting data, for convenience of description.

When the command latch enable signal CLE, the address latch enable signal ALE, and the write enable signal WE are activated to a logic high level, the control signal generator 170 generates the read control signal pair RE and REC based on the reference signal REF_SG. The control signal generator 170 may generate the read control signal pair RE and REC having a period T3 different from the period T1 of the reference signal REF_SG. That is, the control signal generator 170 may generate the read control signal pair RE and REC by varying the period T1 of the reference signal REF_SG. For example, the period T3 of the read control signal pair RE and REC may be faster than the period T1 of the reference signal REF_SG (i.e., T3(≤T1)).

Although the read enable signal RE and REC is not provided from the external device while the nonvolatile memory device 100 operates in the test mode, the nonvolatile memory device 100 may read data from the memory cell array 100 according to the read enable signal pair RE and REC generated by the control signal generator 170. The read data may be provided to the external device in synchronization with the data strobe signal pair DQS and DQSC.

Figure 5:
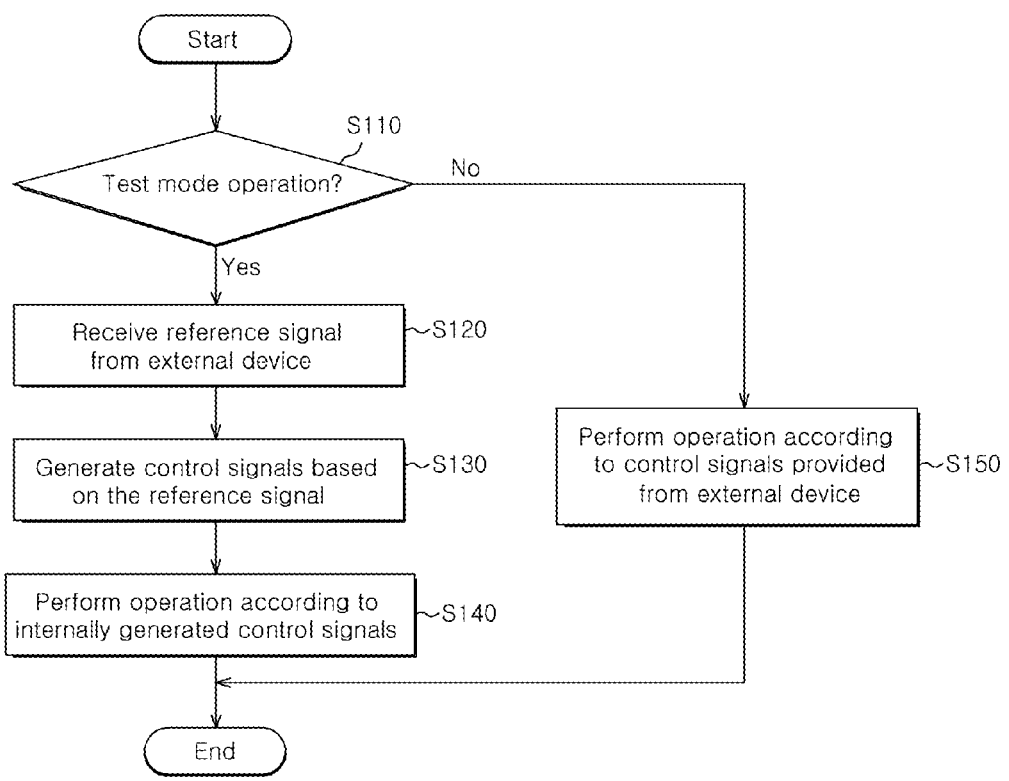
FIG. 5 is a flow chart for explaining a test mode operation of the nonvolatile memory device according to an embodiment.

FIG. 5 is a flow chart for explaining the test mode operation of the nonvolatile memory device according to an embodiment. Referring to FIGS. 1 and 5, the test mode operation of the nonvolatile memory device 100 will be described in detail.

At step S110 (i.e., Test mode operation?), it may be determined whether the nonvolatile memory device 100 is operating in the test mode or not. When the nonvolatile memory device 100 operates in a normal mode (i.e., No), the procedure proceeds to step S150. At step S150 (i.e., Perform operation according to control signals provided from external device), the nonvolatile memory device 100 performs a corresponding operation according to control signals provided from the external device. When the nonvolatile memory device 100 operates in the test mode (i.e., Yes), the control signal generator 170 is enabled, and the procedure proceeds to step S120.

At step S120 (i.e., Receive reference signal from external device), the control signal generator 170 of the nonvolatile memory device 100 receives a reference signal from the external device. The reference signal may be received through a pin (or pad) allocated to a control signal which is not provided from the external device, among the control signals required for operation.

At step S130 (i.e., Generate control signals based on the reference signal), the control signal generator 170 generates control signals based on the received reference signal. The generated control signals indicate the control signals which are not provided from the external device. The generated control signals may include a control signal provided to input data to the nonvolatile memory device 100, for example, a data strobe signal. The generated control signals may include a control signal used to read data from memory cells of the nonvolatile memory device 100, for example, a read enable signal.

At step S140 (i.e., Perform operation according to internally generated control signals), the nonvolatile memory device 100 performs a corresponding operation according to the internally-generated control signals.

The nonvolatile memory device 100 according to an embodiment may generate control signals which are not provided, based on the reference signal, even though a part of control signals required for operation are not provided from the external device while the nonvolatile memory device 100 operates in the test mode. Therefore, the number of pins (or pads) for applying control signals required for controlling the nonvolatile memory device 100 may be reduced. Furthermore, the control of the nonvolatile memory device 100 may be simplified.

According to the embodiments of the present invention, it is possible to effectively test the nonvolatile memory device.

While various embodiments have been described above, it will be understood to those skilled in the art that the embodiments described are by way of example only. Accordingly, the nonvolatile memory device described herein should not be limited based on the described embodiments.

What is claimed is:

1. A nonvolatile memory device comprising:
a memory cell arranged at a region where a word line and a bit line cross each other;
a control signal generator configured to be enabled while the nonvolatile memory device operates in a test mode, and generate control signals having a first period, which are not provided from an external device, based on a reference clock signal having a second period different from the first period, which is provided from the external device; and
a control logic configured to control an operation for the memory cell according to the generated control signals.

2. The nonvolatile memory device according to claim 1, wherein the generated control signals comprise a data strobe signal for receiving data to be programmed into the memory cell.

3. The nonvolatile memory device according to claim 2, wherein the generated control signals comprise a data strobe complementary signal having the opposite phase of the data strobe signal.

4. The nonvolatile memory device according to claim 1, further comprising a data read/write circuit configured to store data in the memory cell, or read data stored in the memory cell, and temporarily store the read data.

5. The nonvolatile memory device according to claim 4, wherein the generated control signals comprise a read control signal for controlling the data read/write circuit to output the read data to the external device.

6. The nonvolatile memory device according to claim 5, wherein the generated control signals comprise a read control complementary signal having the opposite phase of the read control signal.

7. The nonvolatile memory device according to claim 1, wherein the reference signal is provided through any one of pads allocated to receive the control signals which are not provided from the external device.

8. The nonvolatile memory device according to claim 1, wherein the control signal generator is configured to generate the control signals having a different period from the reference signal.

9. The nonvolatile memory device according to claim 8, wherein the control signal generator is configured to generate the control signals having a faster period than the reference signal.

10. The nonvolatile memory device according to claim 1, wherein the control signal generator is configured to generate any one of a data strobe signal for receiving data to be programmed into the memory cell and a read control signal for controlling data read from the memory cell to be outputted to the external device, according to a combination of a command latch enable signal, an address latch enable signal, and a write enable signal.

11. The nonvolatile memory device according to claim 1, wherein the control signal generator is configured to be enabled in response to a test mode enable signal.

12. An operating method of a nonvolatile memory device including one or more of memory cells, comprising the steps of:
determining whether the nonvolatile memory device is operating in a test mode or not;
generating control signals which are not provided from an external device, based on a reference signal provided from the external device, when the nonvolatile memory device operates in the test mode; and
performing a test operation according to the generated control signals.

13. The operating method according to claim 12, further comprising generating control signals when the nonvolatile memory device operates in the test mode and after receiving a test mode enable signal.

14. The operating method according to claim 12, wherein, when the nonvolatile memory device operates in a normal mode, the nonvolatile memory device performs an operation according to control signals provided from the external device.

15. The operating method according to claim 12, wherein the generated control signals comprise a data strobe signal for receiving data to be programmed into the memory cell.

16. The operating method according to claim 15, wherein the data strobe signal has a faster period than the reference signal.

17. The operating method according to claim 15, wherein the generated control signals comprise a data strobe complementary signal having the opposite phase of the data strobe signal.

18. The operating method according to claim 12, wherein the generated control signals comprise a read control signal for controlling data read from the memory cell to be outputted to the external device.

19. The operating method according to claim 18, wherein the read control signal has a faster period than the reference signal.

20. The operating method according to claim 18, wherein the generated control signals comprise a read control complementary signal having the opposite phase of the read control signal.

21. The operating method according to claim 12, wherein generating control signals comprises generating any one of a data strobe signal for receiving data to be programmed into the nonvolatile memory device and a read control signal for controlling data read from the nonvolatile memory device to be outputted to an external device, according to a combination of a command latch enable signal, an address latch enable signal, and a write enable signal.

22. A nonvolatile memory device comprising:
a memory cell arranged at a region where a word line and a bit line cross each other;
a control signal generator configured to be enabled while the nonvolatile memory device operates in a test mode, and generate control signals having a first period based on a reference clock signal having a second period different from the first period, which is provided from an external device; and a control logic configured to control an operation for the memory cell according to the generated control signals.

23. The nonvolatile memory device according to claim 22, wherein the generated control signals comprise:

a data strobe signal for receiving data to be programmed into the memory cell; and a data strobe complementary signal having the opposite phase of the data strobe signal.

\* \* \* \* \*